(12) United States Patent  (10) Patent No.: US 8,130,122 B2
Tseng                       (45) Date of Patent:     Mar. 6, 2012

(54) INPUT DEVICE WITH A FLEXIBLE CIRCUIT BOARD AND RELATED COMPUTER SYSTEM

(75) Inventor: Tien-Chung Tseng, Taipei Hsien (TW)

(73) Assignee: Wistron Corporation, New Taipei (TW)

( * ) Notice: Subject to any disclaimer, the term of this patent is extended or adjusted under 35 U.S.C. 154(b) by 887 days.

(21) Appl. No.: 12/176,417

(22) Filed: Jul. 21, 2008

(65) Prior Publication Data

US 2009/0250328 A1    Oct. 8, 2009

(30) Foreign Application Priority Data

Apr. 3, 2008   (TW) ................................ 97112176 A

(51) Int. Cl.
*H03K 17/94*   (2006.01)
*H03M 11/00*   (2006.01)
(52) U.S. Cl. ......................................................... 341/22
(58) Field of Classification Search .................... 200/512
See application file for complete search history.

(56) References Cited

U.S. PATENT DOCUMENTS

| 4,517,628 | A  | * | 5/1985 | McDermott | 362/186 |
| 6,585,435 | B2 | * | 7/2003 | Fang | 400/479 |
| 6,867,712 | B2 | * | 3/2005 | Tai | 341/22 |
| 2008/0001787 | A1 | * | 1/2008 | Smith et al. | 341/23 |

FOREIGN PATENT DOCUMENTS

| CN | 2539213 Y | 3/2003 |
| CN | 2816915 Y | 9/2006 |
| TW | 00584241 | 4/2004 |

* cited by examiner

*Primary Examiner* — Renee S Luebke
*Assistant Examiner* — Lheiren Mae Caroc
(74) *Attorney, Agent, or Firm* — Winston Hsu; Scott Margo

(57) ABSTRACT

An input device includes a body, and a flexible circuit board connected to the body and receivable inside the body. A plurality of keys is disposed on the flexible circuit board. The input device further includes a signal transmission module installed inside the body and electrically connected to the flexible circuit board for transmitting data corresponding to signals generated by the plurality of keys to a host.

16 Claims, 7 Drawing Sheets

INPUT DEVICE WITH A FLEXIBLE CIRCUIT BOARD AND RELATED COMPUTER SYSTEM

BACKGROUND OF THE INVENTION

1. Field of the Invention

The present invention relates to an input device and a related computer system, and more particularly, to an input device integrating a stylus and a keyboard and a related computer system.

2. Description of the Prior Art

In modern information society, portable electronic devices are widely used in every field. A large quantity of data is communicated, processed, and stored in digital data format, thus computers used for reading and accessing data have become very important tools. Especially portable computers such as notebooks and personal digital assistants (PDAs), which by their small size, lightness, and portability, help users to search, browse, and store various kinds of data at anytime at any place. Therefore, portable computers have become one of the most important digital data platforms and the focus of much development. Concerning portable computers, both compactness and usability of the human input interface are emphasized; therefore a touch panel is used as part of the man machine interface (MMI). When a user touches or presses on the touch panel, the touch panel can sense the position or even the strength of the stress and control the computer according to the associated command.

However there is still a need for conventional keyboards such as typing. For example, Taiwan patent publication no. 00584241 discloses a portable and detachable keyboard of a small size so that there is no need to install an internal keyboard on the portable electronic device. But it is still inconvenient for portability and cost of the external keyboard. There is a need to design a convenient keyboard input device collocating with a portable electronic device.

SUMMARY OF THE INVENTION

According to the claimed invention, an input device includes a body, and a flexible circuit board connected to the body and receivable inside the body. A plurality of keys is disposed on the flexible circuit board. The input device further includes a signal transmission module installed inside the body and electrically connected to the flexible circuit board for transmitting data corresponding to signals generated by the plurality of keys to a host.

According to the claimed invention, a computer system includes a host including a first signal transmission module, and an input device including a body, and a flexible circuit board connected to the body and receivable inside the body. A plurality of keys is disposed on the flexible circuit board. The input device further includes a second signal transmission module installed inside the body and electrically connected to the flexible circuit board for transmitting data corresponding to signals generated by the plurality of keys to the first signal transmission module of the host.

According to the claimed invention, a computer system includes a host including a signal transmission module, and an input device including a flexible circuit board connected to the body and receivable inside the body. A plurality of keys is disposed on the flexible circuit board for transmitting signals to the signal transmission module.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
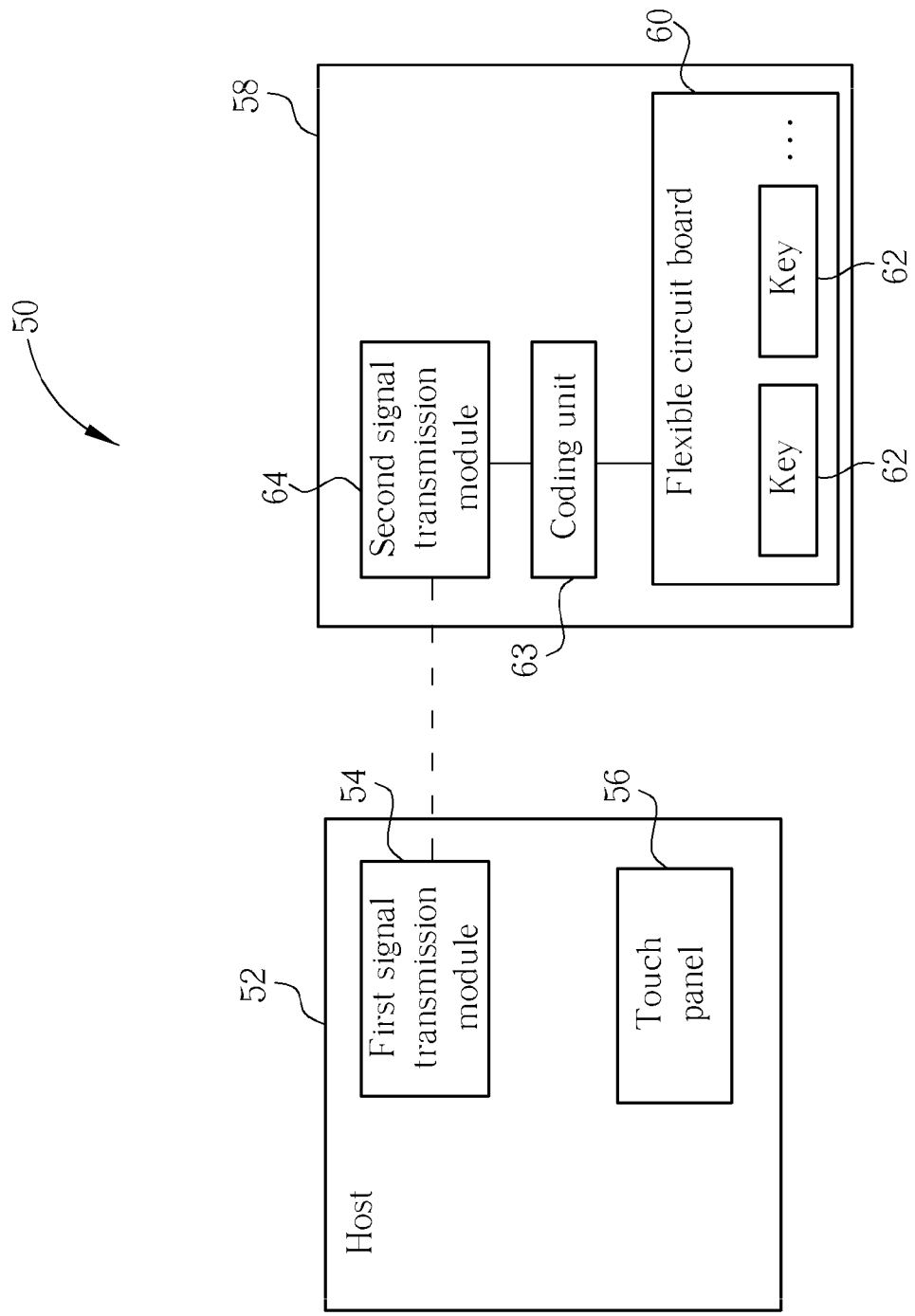
FIG. 1 is a functional block diagram of a computer system according to a preferred embodiment of the present invention.

Please refer to FIG. 1. FIG. 1 is a functional block diagram of a computer system 50 according to a preferred embodiment of the present invention. The computer system 50 includes a host 52 which can be a portable electronic device, such as a notebook, a tablet computer, a personal digital assistant (PDA), a global positioning system device, and so on. The host 52 includes a first signal transmission module 54 for receiving signals, and a touch panel 56 as a display and input interface. The computer system 50 further includes an input device 58 including a flexible circuit board 60 which can be a flexible printer circuit board. A plurality of keys 62 is disposed on the flexible circuit board 60. The input device 58 further includes a coding unit 63 electrically connected to the plurality of keys 62 for coding signals generated by the plurality of keys 62, and a second signal transmission module 64 electrically connected to the flexible circuit board 60 for transmitting data corresponding to signals generated by the plurality of keys 62 to the first signal transmission module 54 of the host 52. The first signal transmission module 54 and the second signal transmission module 64 can be a wireless signal transmission module respectively, and the second signal transmission module 64 can transmit data corresponding to signals generated by the plurality of keys 62 to the first signal transmission module 54 wirelessly, such as with Bluetooth technology, infrared technology, RFID technology, and so on. Besides, the first signal transmission module 54 and the second signal transmission module 64 can be a wired signal transmission module respectively, and the second signal transmission module 64 can transmit data corresponding to signals generated by the plurality of keys 62 to the first signal transmission module 54 with cable connection.

Figure 2:
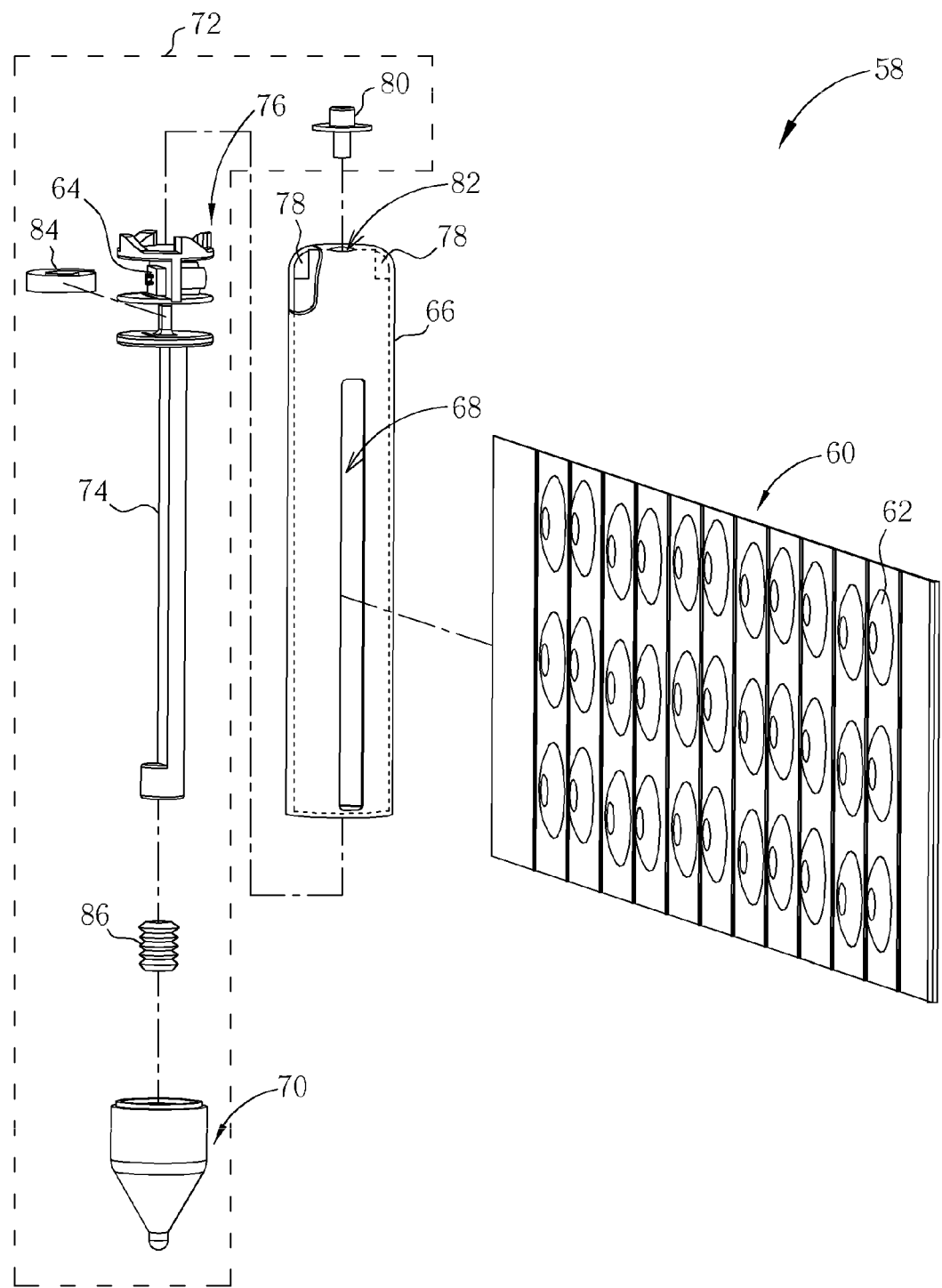
FIG. 2 is an explode diagram of an input device according to the preferred embodiment of the present invention.

Please refer to FIG. 2. FIG. 2 is an explode diagram of the input device 58 according to the preferred embodiment of the present invention. The input device 58 includes a body 66 whereon a slot 68 is formed, and a head 70 connected to the body 66 for pressing the touch panel 56 of the host 52. The touch panel 56 can sense the position or even the strength of the stress and control the host 52 according to the associated command. That is, the body 66 and the head 70 are formed as a stylus for pressing the touch panel 56. The input device 58 further includes a rotary mechanism 72 installed inside the body 66 for scrolling the flexible circuit board 60 through the slot 68. The rotary mechanism 72 further includes a shaft 74 installed inside the body 66 in a rotatable manner and connected to the flexible circuit board 60. The flexible circuit board 60 can be connected to the shaft 74 in a thermo compression bonding method or is glued to the shaft 74. The rotary mechanism 72 further includes a ratchet 76 connected to the shaft 74 in a rotatable manner, and at least one stopper 78 installed inside the body 66 for stopping the ratchet 76. The rotary mechanism 72 further includes a releasing component 80 for releasing constraint of the ratchet 76 by the stopper 78 so that the stopper 78 can not stop the ratchet 76. The releasing component 80 can be a key passing through a hole 82 on an end of the body 66. A user can press the releasing component 80 for pushing the ratchet 76 so as to release constraint of the ratchet 76 by the stopper 78. The rotary mechanism 72 further includes a first elastic component 84 connected to the shaft 76 and the body 66 for driving the shaft 74 to rotate so as to scroll the flexible circuit board 60 inside the slot 68 when the releasing component 80 releases constraint of the ratchet 76 by the stopper 78. The first elastic component 84 can be a volute spring. The rotary mechanism 72 further includes a second elastic component 86 connected to an end of the shaft 74 and installed inside the head 70 for upwardly pushing the shaft 74 to a position where the ratchet 76 and the stopper 78 are on the same level when the user does not press the releasing component 80. The second elastic component 86 can be a spring. Then the first elastic component 84 can drive the ratchet 74 to rotate to a position where the stopper 78 stops the ratchet 76.

Figure 3:
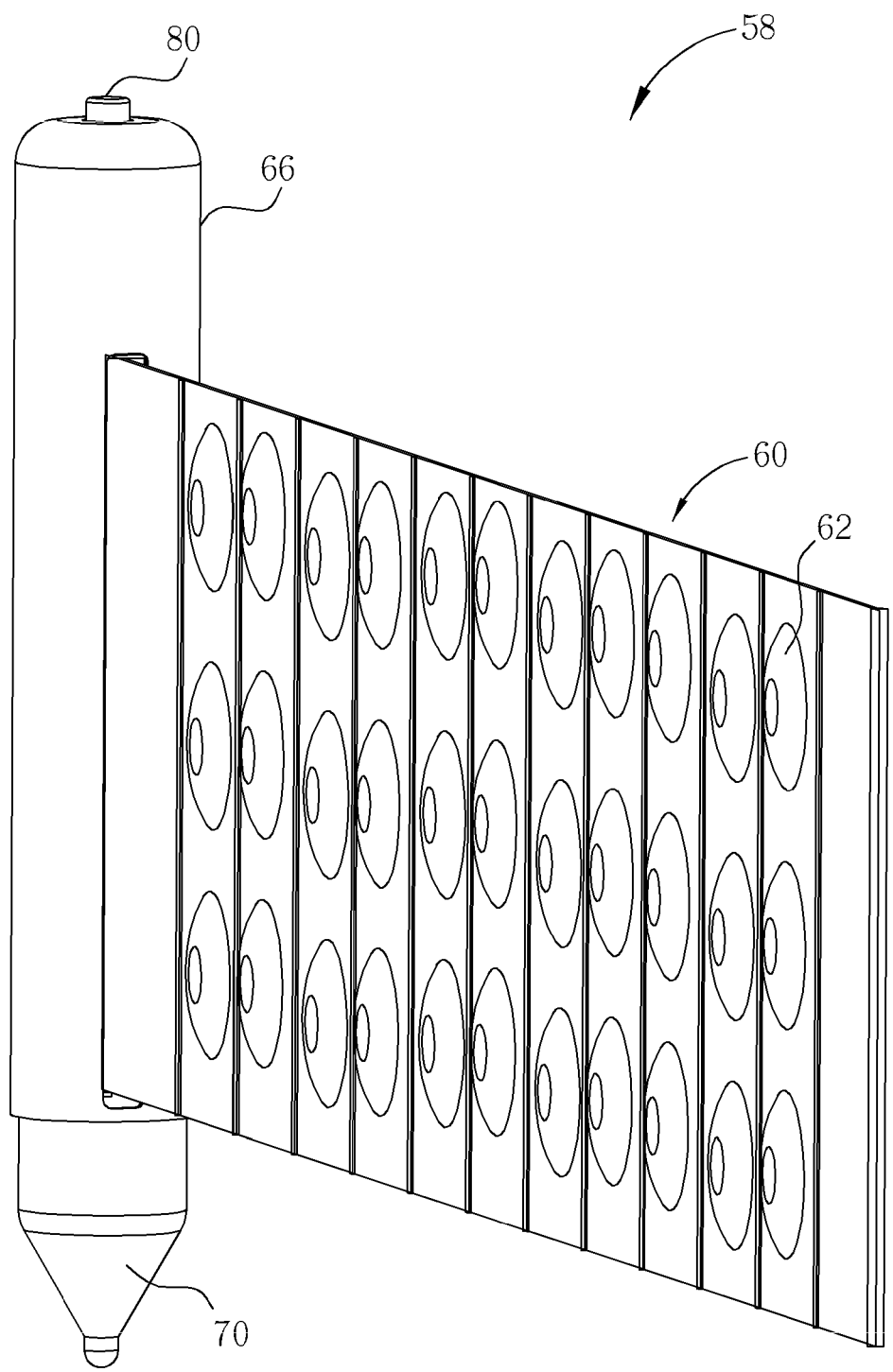
FIG. 3 is a schematic drawing of the assembled input device according to the preferred embodiment of the present invention.
Figure 4:
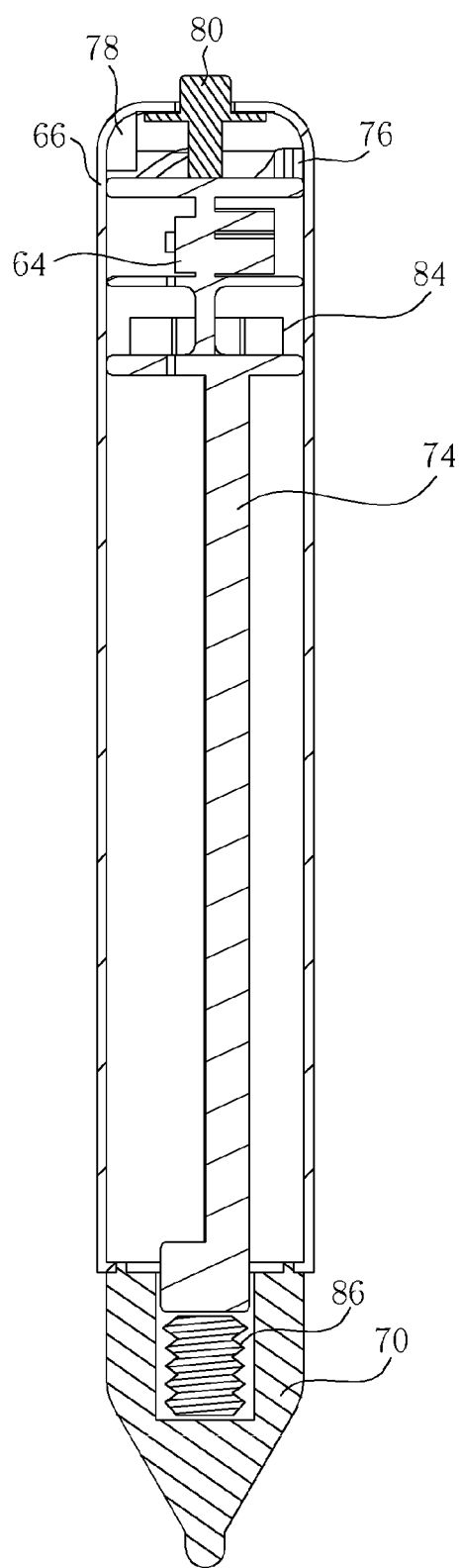
FIG. 4 is a sectional view of the input device according to the preferred embodiment of the present invention.
Figure 5:
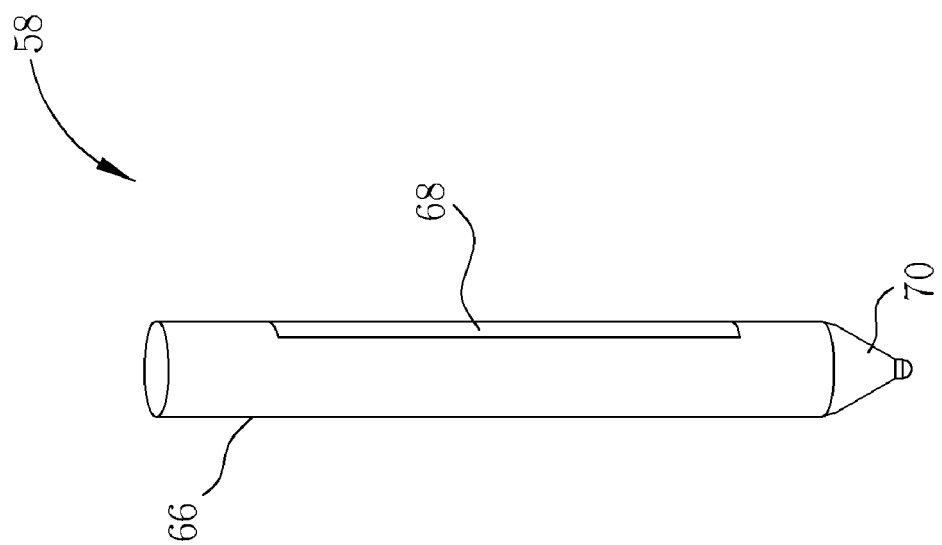
FIG. 5 is a diagram of a flexible circuit board received inside a body according to the preferred embodiment of the present invention.
Figure 6:
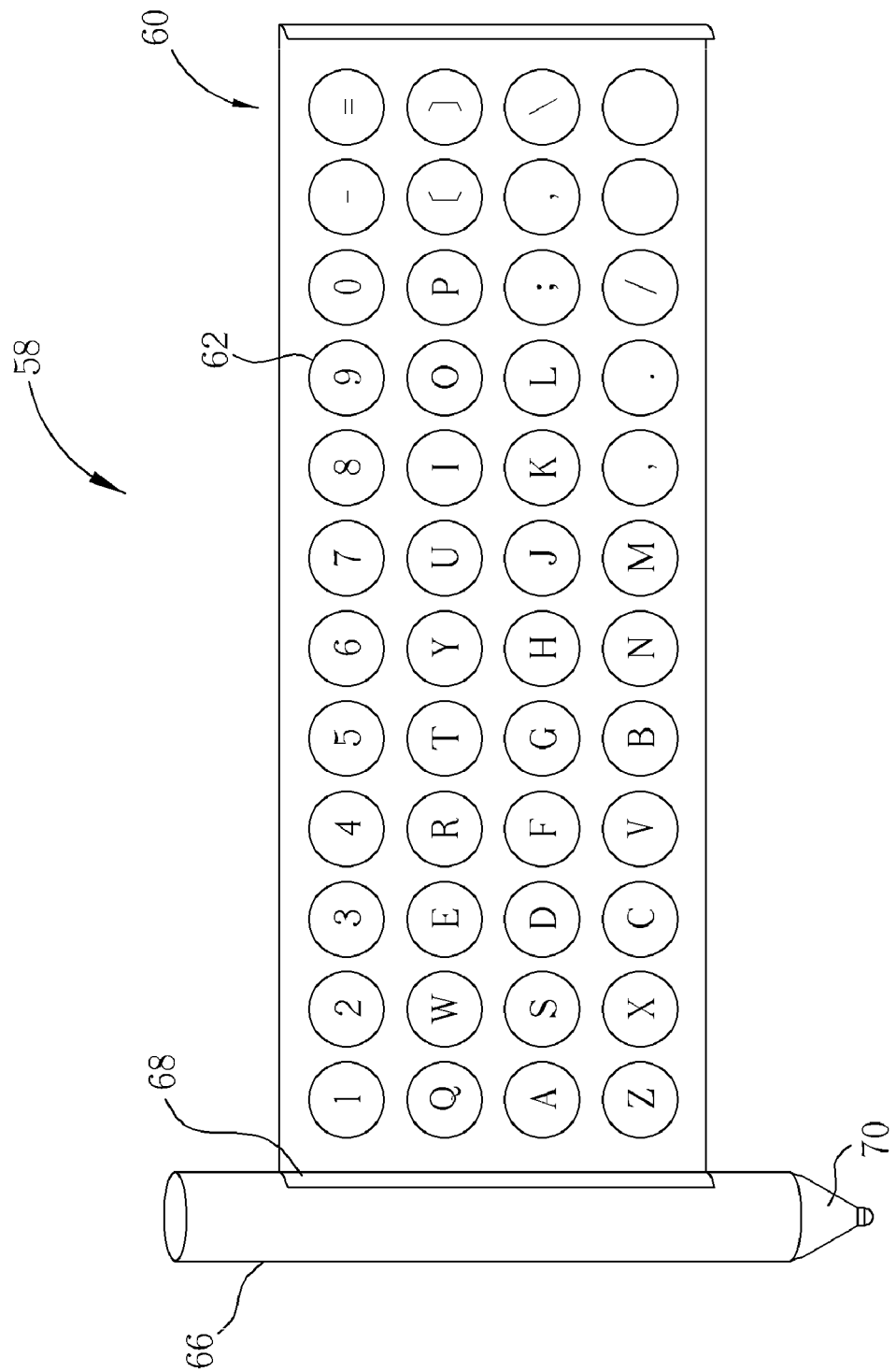
FIG. 6 is a diagram of the flexible circuit board expanding outside the body according to the preferred embodiment of the present invention.

Please refer to FIG. 3 to FIG. 6. FIG. 3 is a schematic drawing of the assembled input device 58 according to the preferred embodiment of the present invention. FIG. 4 is a sectional view of the input device 58 according to the preferred embodiment of the present invention. FIG. 5 is a diagram of the flexible circuit board 60 received inside the body 66 according to the preferred embodiment of the present invention. FIG. 6 is a diagram of the flexible circuit board 60 expanding outside the body 66 according to the preferred embodiment of the present invention. When the user wants to use keyboard function, the user can press the releasing component 80 to release constraint of the ratchet 76 by the stopper 78. The releasing component 80 pushes the ratchet 76, and the shaft 74 presses the second elastic component 86 in an original condition so as to compress the second elastic component 86. Then the user can draw out the flexible circuit board 60, and the flexible circuit board 60 drives the shaft 74 to rotate so that the first elastic component 84 rotates and deforms accordingly. After the flexible circuit board 60 has been drawn out completely, the user can stop pressing the releasing component 80. At this time, the shaft 74 can not press the second elastic component 86 anymore, and the second elastic component 86 restores to the original condition elastically and pushes the shaft 74 to a position where the ratchet 76 and the stopper 78 are on the same level. Then the user can release the flexible circuit board 60, and the first elastic component 84 applies an elastic restoring force to the shaft 74 so as to drive the shaft 74 to rotate to a position where the stopper 78 stops the ratchet 76. The flexible circuit board 60 is fixed as shown in FIG. 6. Symbols are printed on an outer layer of the flexible circuit board 60, and the circuit is printed on an inner layer of the flexible circuit board 60. The plurality of keys 62 generates and transmits signals to the coding unit 63 via the circuit when being pressed. The coding unit 63 can be disposed on the flexible circuit board 60 or inside the body 66. The coding unit 63 encodes the signals generated by the plurality of keys 62, and then transmits the encoded signals to the second signal transmission module 64. The second signal transmission module 64 transmits the encoded signals to the first signal transmission module 54 of the host 52. The host 52 can decode the encoded signals and operates accordingly. The input device 58 can include the coding unit 63 selectively. That is, the coding unit 63 can be omitted, and the second signal transmission module 64 transmits data corresponding to the signals generated by the plurality of keys 62 to the first signal transmission module 54 of the host 52. The host 52 can encode/decode the data and operates accordingly.

When the user wants to receive the flexible circuit board 60, the user can press the releasing component 80 to release constraint of the ratchet 76 by the stopper 78 again. The releasing component 80 pushes the ratchet 76, and the shaft 74 presses the second elastic component 86 in the original condition so as to compress the second elastic component 86. At this time, the user does not have to apply force to the flexible circuit board 60. Because the stopper 78 can not stop the ratchet 76, the first elastic component 84 restores to the original condition and applies an elastic restoring force to the shaft 74 so as to drive the shaft 74 to rotate for receiving the flexible circuit board 60 inside the body 66 as shown in FIG. 5. After the flexible circuit board 60 has been received inside the body 66 completely, the user can stop pressing the releasing component 80 so that the shaft 74 can not press the second elastic component 86. The second elastic component 86 restores to the original condition elastically and pushes the shaft 74 to the position where the ratchet 76 and the stopper 78 are on the same level so that the stopper 78 is capable of stopping the ratchet 76 again.

Figure 7:
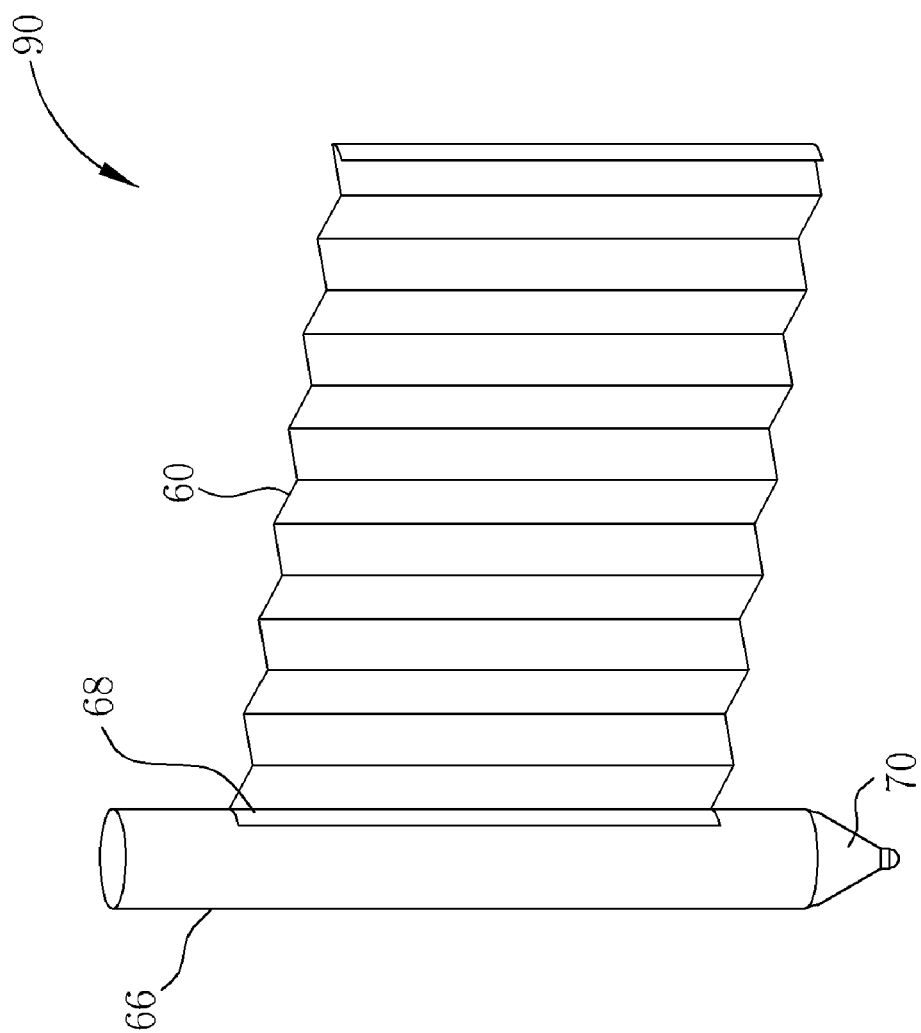
FIG. 7 is a schematic drawing of an input device according to another embodiment of the present invention.

Please refer to FIG. 7, FIG. 7 is a schematic drawing of an input device 90 according to another embodiment of the present invention. The flexible circuit board 60 of the input device 90 is connected to the body 66 and receivable inside the body 66 in a foldable manner. That is, the input device 90 has no additional mechanism for receiving the flexible circuit board 60, and the user folds up the flexible circuit board 60 to reduce the size thereof and puts the flexible circuit board 60 inside the body 66 through the slot 68 directly.

In conclusion, the input device of the present invention combines two input interfaces of a stylus and a keyboard, and the stylus and the keyboard can be combined with any manners, such as scrolling or folding. For example, the flexible circuit board can be connected to the body of the stylus and be scrolled to cover the body without the rotary mechanism for driving the flexible circuit board. Any mechanism of combining the stylus and the keyboard is within the scope of the present invention.

In contrast to the prior art, the input device of the present invention combines two input interfaces of the stylus and the keyboard for solving the problem of inconvenient portability and cost of the external keyboard. The present invention provides a convenient input device collocating with a portable electronic device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An input device comprising:
   a body whereon a slot is formed;
   a flexible circuit board connected to the body and receivable inside the body, a plurality of keys being disposed on the flexible circuit board;
   a signal transmission module installed inside the body and electrically connected to the flexible circuit board for transmitting data corresponding to signals generated by the plurality of keys to a host; and a rotary mechanism installed inside the body for scrolling the flexible circuit board through the slot, the rotary mechanism comprising:

a shaft installed inside the body in a rotatable manner and connected to the flexible circuit board;

a ratchet connected to the shaft in a rotatable manner;

a stopper installed inside the body for stopping the ratchet; and a second elastic component connected to an end of the shaft for pushing the shaft to a position where the stopper stops the ratchet.

2. The input device of claim 1, wherein the flexible circuit board is connected to the shaft in a thermo compression bonding method or is glued to the shaft.

3. The input device of claim 1, wherein the rotary mechanism further includes a releasing component for releasing constraint of the ratchet by the stopper.

4. The input device of claim 3, wherein the releasing component is a key passing through a hole on the body.

5. The input device of claim 3, wherein the rotary mechanism further includes a first elastic component connected to the shaft and the body for driving the shaft to rotate so as to scroll the flexible circuit board inside the slot when the releasing component releases constraint of the ratchet by the stopper.

6. The input device of claim 5, wherein the first elastic component is a volute spring.

7. The input device of claim 1, wherein the second elastic component is a spring.

8. The input device of claim 1, further comprising a head connected to the body wherein the second elastic component is installed inside the head.

9. The input device of claim 1, wherein the flexible circuit board is a flexible printed circuit board.

10. The input device of claim 1, wherein the signal transmission module is a wireless signal transmission module for transmitting data corresponding to signals generated by the plurality of keys to the host wirelessly.

11. The input device of claim 1, wherein the signal transmission module is a wired signal transmission module for transmitting data corresponding to signals generated by the plurality of keys to the host with cable connection.

12. The input device of claim 1, further comprising a coding unit for coding signals generated by the plurality of keys.

13. A computer system comprising:

a host comprising a first signal transmission module; and an input device comprising:

a body whereon a slot is formed;

a flexible circuit board connected to the body and receivable inside the body, a plurality of keys being disposed on the flexible circuit board;

a second signal transmission module installed inside the body and electrically connected to the flexible circuit board for transmitting data corresponding to signals generated by the plurality of keys to the first signal transmission module of the host; and a rotary mechanism installed inside the body for scrolling the flexible circuit board through the slot, the rotary mechanism comprising:

a shaft installed inside the body in a rotatable manner and connected to the flexible circuit board;

a ratchet connected to the shaft in a rotatable manner;

a stopper installed inside the body for stopping the ratchet; and a second elastic component connected to an end of the shaft for pushing the shaft to a position where the stopper stops the ratchet.

14. The computer system of claim 13, wherein the rotary mechanism further includes a releasing component for releasing constraint of the ratchet by the stopper.

15. The computer system of claim 14, wherein the rotary mechanism further includes a first elastic component connected to the shaft and the body for driving the shaft to rotate so as to scroll the flexible circuit board inside the slot when the releasing component releases constraint of the ratchet by the stopper.

16. The computer system of claim 13, further comprising a head connected to the body wherein the second elastic component is installed inside the head.

* * * * *